US006246069B1

(12) United States Patent
Hsu et al.

(10) Patent No.: US 6,246,069 B1
(45) **Date of Patent: *Jun. 12, 2001**

(54) THIN-FILM EDGE FIELD EMITTER DEVICE

(75) Inventors: David S. Hsu; Henry F. Gray, both of Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/062,735

(22) Filed: Apr. 20, 1998

Related U.S. Application Data

(62) Division of application No. 08/658,296, filed on Jun. 5, 1996, now Pat. No. 5,742,121, which is a division of application No. 08/321,642, filed on Oct. 11, 1994, now Pat. No. 5,584,740, which is a continuation of application No. 08/040,944, filed on Mar. 31, 1993, now Pat. No. 5,382,185.

(51) Int. Cl.[7] .................................................... H01L 29/06
(52) U.S. Cl. ........................... 257/10; 313/309; 313/310; 313/336; 313/351
(58) Field of Search .................................... 313/309, 310, 313/336, 351, 495, 355; 257/10, 11

(56) References Cited

U.S. PATENT DOCUMENTS 4,095,133 * 6/1978 Hoeberechts ......................... 313/336
4,168,213 * 9/1979 Hoeberechts ........................... 204/15
4,766,340 * 8/1988 Van Der Mast et al. ............ 313/366
5,110,760 * 5/1992 Hsu ...................................... 437/180
5,214,347 * 5/1993 Gray ..................................... 313/355
5,382,185 * 1/1995 Gray et al. ............................. 445/49
5,412,285 * 5/1995 Komatsu ........................... 315/169.1
5,457,355 * 10/1995 Fleming et al. ..................... 313/336
5,714,837 * 2/1998 Zurn et al. ........................... 313/495
5,747,926 * 5/1998 Nakamoto et al. .................. 313/495
5,982,081 * 11/1999 Sin et al. ............................. 313/309

OTHER PUBLICATIONS

Koga et al., New Structure Si Filed [sic] Emitter Arrays with Low Operation Voltage, IEDM 94–23 pp 2.1.1–2.1.4, 1994.*

* cited by examiner

*Primary Examiner*—Jerome Jackson. Jr.
*Assistant Examiner*—Bradley W. Baumeister
(74) *Attorney, Agent, or Firm*—John J. Karasek; Amy L. Ressing

(57) ABSTRACT

A thin-film edge field emitter device includes a substrate having a first portion and having a protuberance extending from the first portion, the protuberance defining at least one side-wall, the side-wall constituting a second portion. An emitter layer is disposed on the substrate including the second portion, the emitter layer being selected from the group consisting of semiconductors and conductors and is a thin-film including a portion extending beyond the second portion and defining an exposed emitter edge. A pair of supportive layers is disposed on opposite sides of the emitter layer, the pair of supportive layers each being selected from the group consisting of semiconductors and conductors and each having a higher work function than the emitter layer.

6 Claims, 14 Drawing Sheets

THIN-FILM EDGE FIELD EMITTER DEVICE

CROSS-REFERENCE TO RELATED APPLICATIONS

This application is a Divisional of commonly assigned U.S. patent application Ser. No. 08/658,296 filed Jun. 5, 1996 by Henry F. Gray and David S. Y. Hsu and having Navy Case No. 77,175 and entitled "Thin-Film Field Emitter Device And Method Of Manufacture Therefor", now U.S. Pat. No. 5,742,121, which is a divisional application of application Ser. No. 08/321,642 filed Oct. 11, 1994, now U.S. Pat. No. 5,584,740, which in turn is a continuation application of application Ser. No. 08/040,944 filed Mar. 31, 1993, now U.S. Pat. No. 5,382,185.

FIELD OF THE INVENTION

The present invention relates to ungated and gated thin-film edge field emitters capable of emitting electrons of relatively low voltage and to methods for making the same.

DESCRIPTION OF THE RELATED ART

Very small localized vacuum electron sources which emit sufficiently high currents for practical applications are difficult to fabricate. This is particularly true when the sources are required to operate at reasonably low voltages. Presently available thermionic sources do not emit high current densities, but rather result in small currents being generated from small areas. In addition, thermionic sources must be heated, requiring special heating circuits and power supplies. Photo emitters have similar problems with regard to low currents and current densities.

Field emitter arrays (FEAs) are naturally small structures which provide reasonably high current densities at low voltages. FEAs typically comprise an array of conical, pyramidal or cuspshaped point, edge or wedge-shaped vertical structures which are electrically insulated from a positively charged extraction gate and which produce an electron beam that travels through an associated opening in the charged gate.

The classical field emitter includes a sharp point at the tip of the vertical structure and opposite an extraction electrode. In order to generate electrons which are not collected at the extraction electrode, but can be manipulated and collected somewhere else, a hole is created in the extraction electrode which hole is significantly larger (e.g. two orders of magnitude) than the radius of curvature of the field emitter. Thus, the extraction electrode is a flat horizontal surface containing an extraction electrode hole for the field emitter. The field emitter is centered horizontally in the extraction electrode hole and does not touch the extraction electrode, although the vertical direction of the field emitter is perpendicular to the horizontal plane of the extraction electrode. The positive charges on the edge of the extraction electrode hole surround the field emitter symmetrically so that the electric field produced between the field emitter and the extraction electrode causes the electrons to be collected on an electrode (anode) separate and distinct from the extraction electrode. A very small percentage of the electrons are intercepted by the extraction electrode. The smaller the aperture, i.e., the closer the extraction electrode is to the field emitter, the lower the voltage required to generate the electron beam.

It is difficult to create FEAs which have reproducibly small radius-of-curvature field emitter tips of conducting materials. Furthermore, it is equally difficult to gate or grid these structures where the gate-to-emitter distance is reasonably small to provide the necessary high electrostatic field at the field emitter tip with reasonably small voltages. The radius of curvature is typically 100–300 angstroms (Å) and the gate-to-emitter distance is typically 0.1–0.5 micrometers ($\mu$m).

Current methods of manufacturing FEAs include wet etching, reactive ion etching, and a variety of field emitter tip deposition techniques. Practical methods generally require the use of lithography which has a number of inherent disadvantages including the high cost of the equipment needed. Furthermore, the high degree of spatial registration required prevents parallel processing, i.e., the fabrication of a very large number of emitters at the same time in a single process.

SUMMARY OF THE INVENTION

It is therefore an object of the present invention to provide a field emitter device which substantially eliminates the need for the use of high spatial resolution lithography in its fabrication.

It is another object of the present invention to provide a field emitter device having inherent advantages over previous electron sources, including higher emission currents, lower power requirements, less expensive fabrication costs and ease of integration with other circuitry.

It is a further object of the present invention to fabricate gated and ungated thin-film edge field emitter devices wherein the spacing between the elements is small enough to enable low voltage operation.

It is a further object of the present invention to fabricate FEAs over a large area in a manner which is inexpensive, yet results in an equal or greater degree of precision and reproducibility when compared with other prior art processes.

The above objects are accomplished by a thin-film edge field emitter device which includes a substrate having a first portion and having a protuberance extending from the first portion, the protuberance defining at least one side-wall, the side-wall constituting a second portion. An emitter layer is disposed on the substrate including the second portion, the emitter layer being selected from the group consisting of semiconductors and conductors and is a thin-film including a portion extending beyond the second portion and defining an exposed emitter edge. A pair of supportive layers is disposed on opposite sides of the emitter layer, the pair of supportive layers each being selected from the group consisting of semiconductors and conductors and each having a higher work function than the emitter layer.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein:

FIG. 25(*b*) is a cross-sectional view of FIG. 25(*a*).

DETAILED DESCRIPTION OF THE PREFERRED EMBODIMENT

Figure 1:
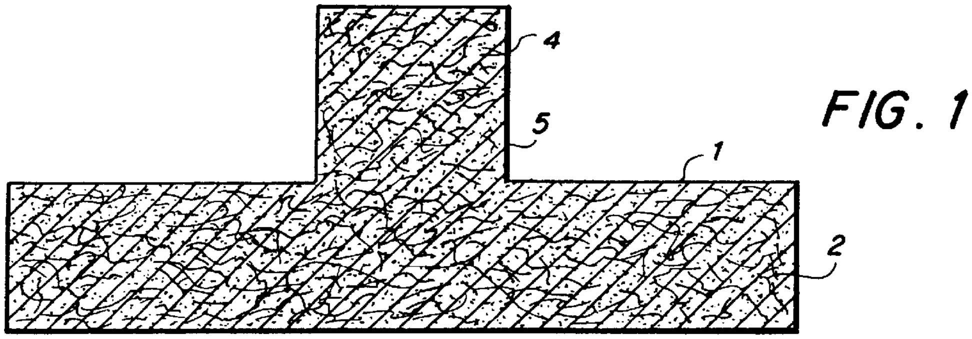
FIG. 1 is a cross-sectional view of a substrate, including a horizontal portion and a non-flat (raised) portion used in one embodiment of the invention.

As discussed above, the present invention is generally directed to FEA structures and devices and to methods of manufacture therefor and, in particular, to thin-film edge field emitters that use the sharp edges of vertical conductive thin-films to provide electron emission. By way of a brief introduction, it is noted that in accordance with one preferred embodiment, the emitters are integrally gated although, as described below, ungated emitters are also provided. Also, in accordance with a preferred embodiment of the method of the invention, the emitter structures and devices are manufactured using chemical beam deposition (CBD) processes to deposit conformal conductive thin-films which constitute the edge emitters of the devices. Flat or horizontal edge field emitters are disclosed in U.S. Pat. No. 5,214,347, issued on May 25, 1993 to Henry F. Gray and entitled "Layered Thin-Edged Field-Emitter Device," which application is hereby incorporated by reference.

CBD techniques used to produce thin substantially vertical metal structures on a substrate are disclosed in U.S. Pat. No. 5,110,760 (Hsu), particularly Step S2 as described in the Specification from column 3, line 17 through column 5, line 40, and in Hsu, et al, "20 Nm Linewidth Platinum Pattern Fabrication Using Conformal Effusive-Source Molecular Precursor Deposition and Sidewall Lithography", J. Vac. Sci. Technol. B10(5), September/October 1992, pp. 2251–2258. The CBD technique is a process for depositing a metallic layer on an exposed surface. The CBD technique has the following features: (1) conformal deposition of material regardless of the orientation or shape of the exposed surface, (2) deposition of very thin films, on the order of 100–300 Å, and (3) production of films having a small grain size, on the order of the film thickness. The first feature (conformal deposition) is effective in maintaining a constant film thickness over a surface which is not necessarily flat. Such a conformal film thickness avoids thermal damage which would otherwise result from electrical conduction through nonuniform conducting material. The second feature (thinness) is basic to the creation of the field emitter of the present invention, since a sharp edge provides a radius of curvature on the order of 100 Å. The third feature (small grain size) arises since the field emitter demands a small radius of curvature, and any large grains would result in a variations of the radius of curvature of the field emitter. Furthermore, large grains might result in a rough surface. The CBD technique also can be used with alloys, thereby permitting the use of a wide variety of conducting materials, such as those that are more resistant to oxidation or those that provide a low work function.

The field emitter electrode of the present invention has a small radius of curvature because the emitter layer itself is thin, on the order of 200–300 Å. The field emitter electrode is resistant to blunting through repeated operation of the device, such as by ion sputtering or other processes that would tend to blunt other types of field emitters. Ion sputtering, as might occur through normal usage of the field emitter device, would merely reduce the height, but would not affect the radius of curvature of a field emitter electrode according to the present invention.

Referring now to the drawings and, more particularly, to FIG. 1 which shows a first step in an exemplary process for manufacturing a thin-film edge emitter, in order to create what is generally referred to as a "raised template," the flat or horizontal surface 1 of a substrate 2 has a protuberance 4 formed thereon having substantially vertical side-walls 5. In being substantially vertical, the side-walls 5 preferably extend at an angle of at least 85° from the flat or horizontal surface 1, and most preferably, at an angle of substantially 90°. In this example, the formation of a cylindrical template or protuberance 4 is shown. Because of its superior electrical and mechanical properties, such a cylindrical structure is preferred, but it is not absolutely required for the practice of this invention, and is merely illustrative. Other shapes, such as those having flat vertical surfaces and those having vertical corners, can also be readily used. Furthermore, the side-walls 5 can be the walls of a trough or recess rather than a protuberance or abutment.

As discussed further below, the protuberance 4 serves as a mold on which layers are deposited. In fabricating the field emitter device of the present invention, the protuberance 4 can be partially or totally removed. In general, it is not needed as part of the structure of the field emitter device, and it is immaterial whether or not any part of protuberance 4 remains in the final structure, unless it is used as part of an extraction gate electrode, as discussed earlier.

The substrate 2 used for fabrication of the emitter can be made of conducting or non-conducting material and is most typically a silicon wafer. Protuberance 4 can be made by a number of conventional fabrication techniques based on, for example, photolithography. The side-walls 5 of the protuberance 4 may be formed at any angle to the substrate surface, but are, most preferably, vertical, i.e., substantially perpendicular to the substrate surface. Accordingly, the side-walls 5 are substantially vertical with respect to horizontal surface 1. As discussed further below, substantially vertical side-walls 5 are advantageously used in conjunction with one or more later steps of directionally selective etching in a direction parallel to the side-walls 5 and perpendicular to the horizontal surface 1. If the side-walls were not substantially parallel to the direction of etching, then material might be disadvantageously removed. Alternatively, this field emitter device could be effectively fabricated using isotropic (non-directional) etching, in which case the angle of the side-wall 5 with respect to the flat or horizontal surface 1 would not be as critical.

Figure 2:
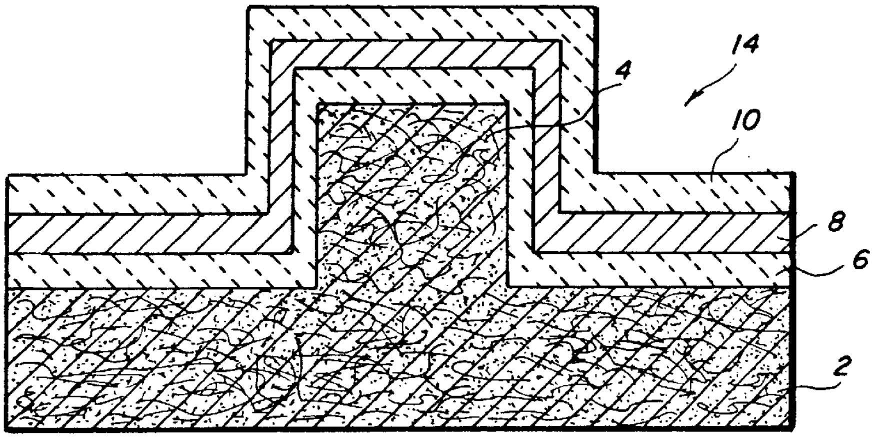
FIG. 2 is a cross-sectional view of a structure formed by depositing two insulating layers and a conducting layer on the substrate of FIG. 1.

In the exemplary embodiment of the invention under consideration, as shown in FIG. 2, a thin-film layer of a dielectric or electrically insulating material 6 is first deposited, for example, by chemical vapor deposition (CVD) techniques, or thermally grown on substrate 2. A conducting material layer 8 is then deposited or disposed on film layer 6, preferably using CBD techniques. Layer 8 will ultimately become the emitter. Thereafter, a second electrically insulating layer 10 is deposited on conducting material layer 8 to form a structure 14. The second insulating layer 10 may be of the same material as or a different material from the first layer 6. Typically, the thickness of the insulating layers 6 and 10 is about 0.1–0.5 μm and the preferred dielectric material is $SiO_2$. A typical thickness for the conducting layer 8 is 200–300 Å and the preferred conducting material is platinum although other materials can be readily used. For example, the conducting layer 8 that ultimately forms the emitter can also comprise homogenous alloys which do not oxidize easily or which have a relatively low work function, such as homogenous platinum alloys, osmium alloys and barium alloys. Furthermore, although CVD is the preferred technique for depositing the electrically insulating layers, other methods can also be used to produce such thin layers. For example, a combined method can be used wherein a silicon layer (to be used as the emitter layer) is deposited using CVD and the layer is then thinned by oxidizing the layer.

Figure 3:
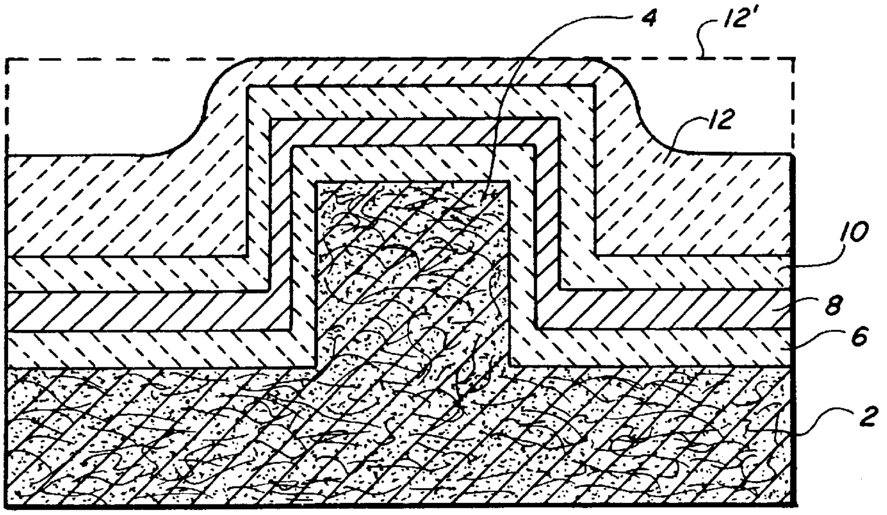
FIG. 3 is a cross-sectional view of the structure of FIG. 2 with a substantially planarized masking layer deposited on the structure.

A masking step is provided next and in the exemplary embodiment shown in FIG. 3, a planarization masking layer 12 is applied over the conducting and insulating layers 6, 8 and 10. As shown, the planarization masking layer 12 roughly conforms to the shape of the underlying structure and is relatively thicker in the area of the side-walls and lower horizontal surface than in the area of the upper surfaces. The planarization masking layer can also be an actual planar layer as indicated at 12', this latter technique thus being closer to true "planarization." The material used in forming the planarization masking layer 12 can be one of a variety of planarization materials such as photoresists, polyimides or spin-on glasses. The planarization masking layer enables the deposited layers to be selectively removed from the top of raised template or protuberance 4, thereby eliminating the need for high spatial resolution lithography techniques which are both expensive and difficult to perform in the sub-micron regime.

Figure 4:
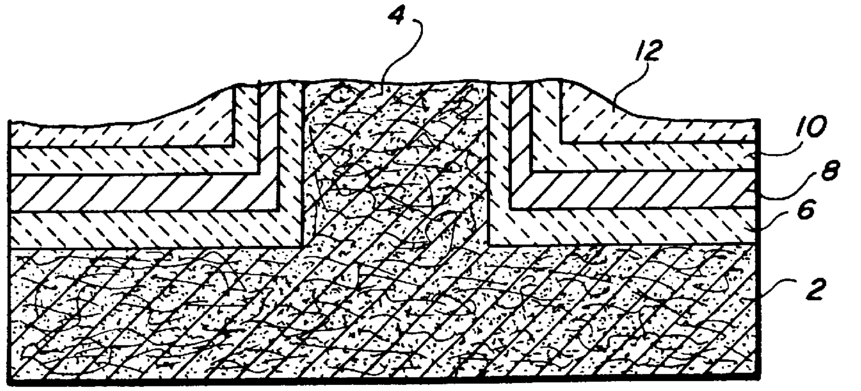
FIG. 4 is a cross-sectional view of the structure of FIG. 3 after etching away the upper part of the insulating layers, the conducting layers, and the planarization masking layer.

Overlying portions of layers 6, 8 and 10 and part of the planarization masking layer 12 (12') are then removed to yield the remaining structure as shown in FIG. 4. These portions are removed by any of a variety of removal techniques such as reactive ion etching (RIE), sputter etching, or wet etching. The removal is preferably directionally selective in the direction perpendicular to the flat or horizontal portion 1 and parallel to the side-wall 5. Such directionally selective removal would be effective with either planarization masking layer 12 or 12'. Alternatively the removal could be isotropic (non-directionally selective), and planarization masking layer 12 would be more effective for such isotropic removal than layer 12', in permitting better removal of portions of layers 6, 8 and 10 as desired, since planarization masking layer 12 would cover more of the structures which are not to be removed, as shown remaining in FIG. 4.

Figure 5:
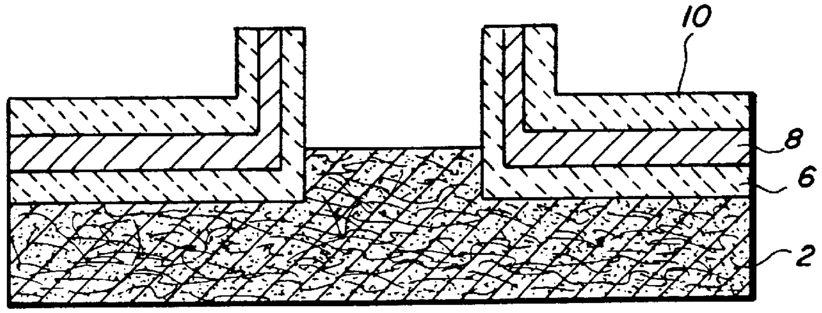
FIG. 5 is a cross-sectional view of the structure of FIG. 4 after etching away an upper portion of the raised part of the substrate.

One or more further etching steps are then used to remove the remaining part of layer 12 or 12', and to remove the upper portion of the raised template or protuberance 4, without removing the adjacent vertically extending thin-film insulators 6 and 10 and conductor 8. The result is shown in FIG. 5. The remaining part of layer 12 or 12' is removed by any of a variety of known means, such as by the use of an oxygen plasma (a gaseous process) or a solvent, such as acetone. The partial removal of protuberance 4 can be accomplished by selective RIE or wet etching.

Figure 6:
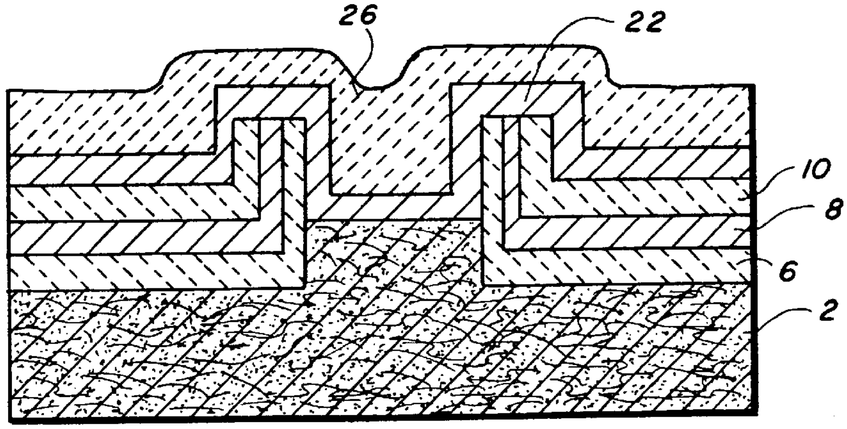
FIG. 6 is a cross-sectional view of the structure of FIG. 5 after the deposition, on the upper surface thereof, of a conductive layer and a planarization masking layer.
Figure 7:
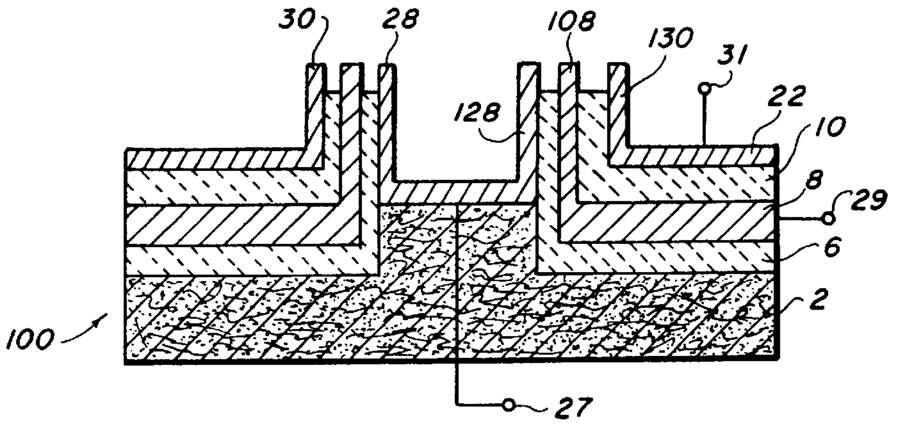
FIG. 7 is a cross-sectional view of a gated field emitter device formed by selectively etching the structure of FIG. 6.

FIGS. 6 and 7 show intermediate and final steps in producing the gated field emitter structure. As shown in FIG. 6, a further thin layer 22 of conducting material is deposited over the upper surface of the structure of FIG. 5 to produce the resulting structure shown in FIG. 6. Preferably, the conducting material 22 is platinum. Conducting layer 22 will become the extraction gate electrodes and can be deposited by any of a variety of deposition means, such as CVD or CBD. The multi-layer structure is then covered by a planarization masking layer 26 of inert material similar to layer 12 (or 12') described above.

Part of planarization masking layer 26 and top portions of the multi-layer structure of FIG. 6 are removed by directional etching (such as RIE or sputtering) so as to produce a structure which includes a central cylindrical conducting layer 8 having a substantially vertical portion 108, which vertical portion 108 acts as the field emitter, and to produce two cylindrical electrically insulating layers 6 and 10, also known as "gate oxide" layers, on either side of conducting layer 8. Furthermore, when the upper portion of conducting layer 22 is etched away there is produced an inner, generally cup-shaped, conducting portion 28 having a substantially vertical portion 128 and an outer cylindrical conducting layer 30 having a vertical portion 130, and these vertical portions 128 and 130 form the extraction gate electrodes or electron extraction electrodes of the emitter device.

As with removal of planarization masking layer 12 or 12', the removal of planarization masking layer 26 and top portions of the multilayer structure of FIG. 6 is preferably directionally selective in the direction perpendicular to the flat or horizontal portion 1 and parallel to the side-wall 5. Such directionally selective removal would be effective with planarization masking layer 26 being substantially a plane or being as shown in FIG. 6. Alternatively, the removal of planarization masking layer 26 could be isotropic (non-directionally selective), and then planarization masking layer 12 would be more effective as shown in FIG. 6 than if it were planar, in order to permit better removal of portions of layers 6, 8 10 and 22 as desired.

Portions of the exposed insulators 6 and 10 are then removed, e.g., by selective RIE, to allow the upper edges of conductors 8, 28 and 30 to project or protrude above the insulators 6 and 10 and thereby expose these conductors, yielding the structure shown in FIG. 7. In the operation of this device, the upper edges of conductors 8, 28, and 30 are separated by a vacuum.

In the gated emitter structure just described, an electrical connection to inner extraction gate or grid 28 is made through the original substrate material 2 as is illustrated schematically by connection 27, while connections to the emitter 8 and the outer extraction gate or grid 30 are indicated schematically at 29 and 31, respectively. As discussed above, in applications where the substrate is conductive, substrate 2 can be made of any type of conducting material which has selective etching properties with respect to the other materials used or can be made of an electrically insulating material with a thin metal layer thereon.

The gated field emitter device 100 shown in FIG. 7 thus includes a substantially flat thin film emitter layer 108, and one or more substantially flat thin film extraction gate layers 128 and 130 substantially parallel to the emitter layer 108. Although not absolutely required for the practice of this invention, the emitter layer 108 and one or more extraction gate layers 128 and 130 are substantially perpendicular to a flat portion 1 of a substrate 2. The emitter layer 108 and one or more extraction gate layers 128 and 130 are separated by one or more electrically insulating layers 6 and 10 except for exposed edges of layers 108, 128 and 130. In the operation of the device 100 as a gated field emitter, the exposed edge of emitter layer 108 has a small radius of curvature and emits electrons. The exposed edges of one or more extraction gate layers 128 and 130 are separated from the exposed edges of emitter layer 108 by a vacuum and the one or more extraction gate layers 128 and 130 act as extraction gate electrodes. The exposed edge of emitter layer 108 typically has a radius of curvature of about 100–150 Å or less, and is typically separated from the extraction gate electrodes 128 and 130 by about 0.1–0.5 $\mu$m. This gated field emitter device 100 can be operated with a potential difference between the emitter layer 108 and the extraction gate electrodes 128 and 130 of 150 Volts (V) or less, and since the electric field in the region between the emitter layer 108 and the extraction gate electrodes 128 and 130 is then on the order of $3\text{–}5*10^7$ V/(centimeter (cm)$^2$), the device 100 would effectively emit electrons in the general direction parallel to the emitter layer 108 and away from the insulator layers 6 and 10. In a typical structure, the emitted electrons would be attracted to and collected by an anode electrode (not shown).

Figure 8:
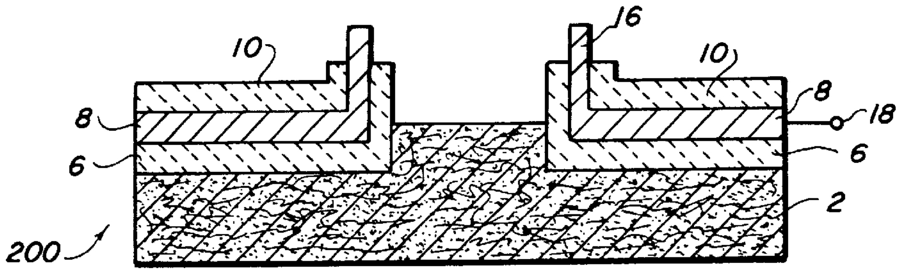
FIG. 8 is a cross-sectional view of an ungated emitter device formed by selectively etching the structure of FIG. 5.

Referring now to FIG. 8, an ungated emitter structure 200 in accordance with a preferred embodiment of the invention is shown. It will be appreciated that the structure shown in FIG. 8 is similar to that of FIG. 5 and thus can be fabricated in a similar manner, except that the upper portions of the electrically insulating layers 6 and 10 have been removed to expose the upper emitter edge 16 of conductive film layer 8 and an electrical connection is made to conductive layer 8 as is schematically indicated at 18. The emitter structure of FIG. 8, which can be used in diode applications, can be particularly useful in a so-called "bed of nails" configuration, i.e., a FEA where a large number of upwardly projecting field emitters ("nails") are provided over a relatively large surface area in spaced relation to an overlying conductive plate (not shown) which constitutes the anode of the FEA diode. As mentioned above, the parallel processing capabilities of the invention enable a large number of the emitters of the array to be produced at the same time, rather than having to produce the field emitters individually or in small groups.

In the embodiment illustrated in FIG. 8, insulators 6 and 10 provide mechanical rigidity or stability so as to enable the thin-film emitter 8 to extend a substantial distance above the substrate, i.e., impart enhanced mechanical strength to the sandwich construction of the film 8 and insulators 6 and 10. In addition, insulators 6 and 10 enhance heat removal from the device. The ungated structure 200 of FIG. 8 differs from the gated structure 100 of FIG. 7 in that it does not have any extraction gate electrodes. In the operation of ungated emitter device 200 shown in FIG. 8, the emitter emits electrons from the exposed part of the conductive film layer 8 in the direction generally away from insulating layers 6 and 10.

Figure 9:
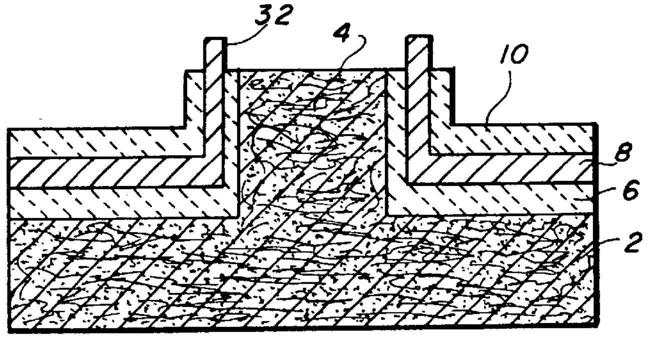
FIG. 9 is a cross-sectional view of an intermediate structure formed, during a method in accordance with a second embodiment of the present invention, from the structure of FIG. 4.
Figure 10:
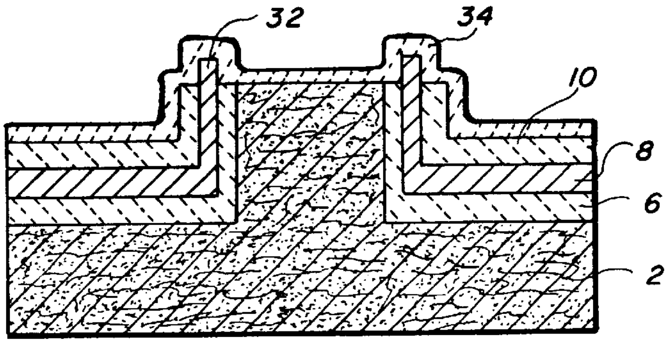
FIG. 10 is a cross-sectional view of the structure of FIG. 9 after the deposition of a further insulating layer on the upper surface thereof.
Figure 11:
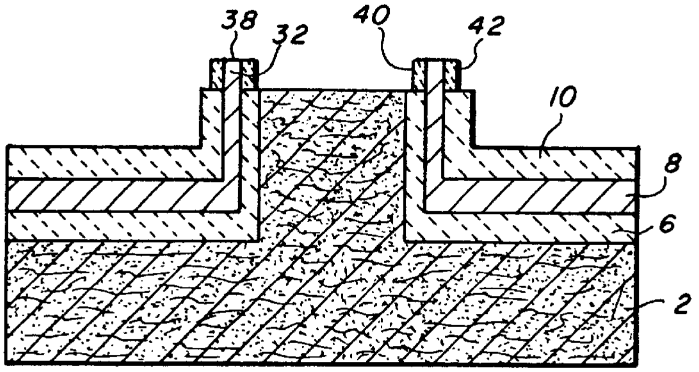
FIG. 11 is a cross-sectional view of the structure of FIG. 10 after etching away part of the further insulating layer.
Figure 12:
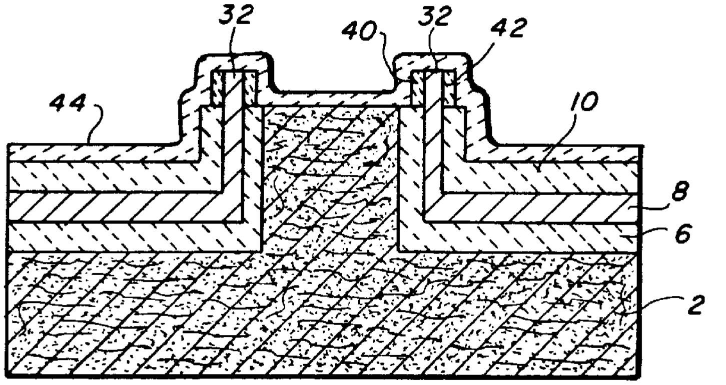
FIG. 12 is a cross-sectional view of the structure of FIG. 11 after the deposition of a further conducting layer on the upper surface.
Figure 13:
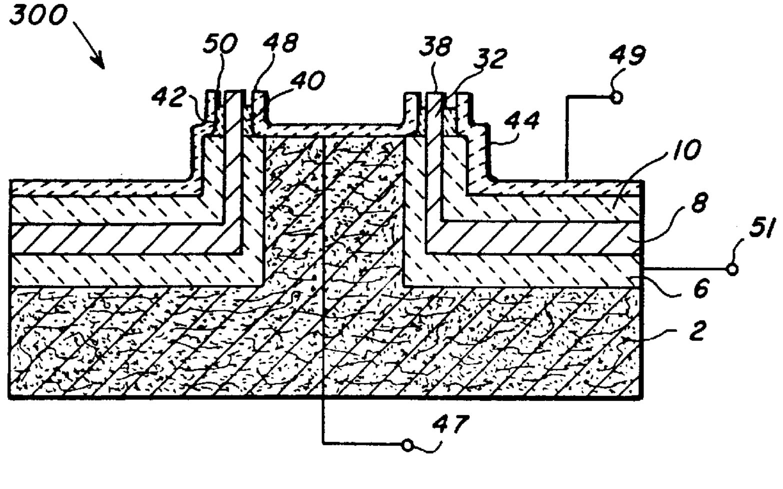
FIG. 13 is a gated emitter device formed by selectively etching the structure of FIG. 12.
Figure 14:
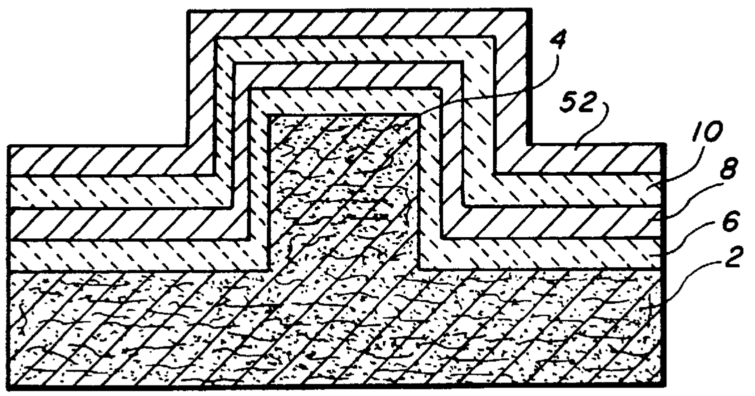
FIG. 14 is a cross-sectional view of a structure formed, during a method in accordance with a third embodiment of the present invention, by depositing a further conductive layer on the upper surface of the structure of FIG. 2.

Referring now to FIG. 9, in accordance with a method for fabricating a second, symmetrical embodiment of the gated emitter structure, the method is similar to that described above up to the production of the structure shown in FIG. 4. Thereafter, the electrically insulating layers 6 and 10 of the structure shown in FIG. 4 are etched away at the upper regions to expose the upper edge portion 32 of central conducting film layer 8, using standard selective etching techniques. Next, as shown in FIG. 10, at least one additional electrically insulating layer 34 is deposited over the entire upper surface of the structure thereby covering emitter film edge 32. Layer 34 will ultimately be used to provide the required extraction gate insulation. In this regard insulating layer 34 is next etched away, as shown in FIG. 11, to expose the upper edge 38 of emitter film edge portion 32 and to leave inner and outer extraction gate insulator layers 40 and 42 of equal thickness surrounding, i.e., on opposite sides of, conductive film layer 32. In the next step, a conductive layer 44 is then conformably deposited over the upper surface of the structure as shown in FIG. 12. Planarization and etching procedures similar to those discussed above are then used so that the final gated field emitter structure 300 is as shown in FIG. 13. In particular, as illustrated, the resultant gated emitter structure is formed by etching away the upper edge portions of conductive layer 44 and selectively etching away parts of the insulators 40 and 42 between vertically extending inner and outer parts of conductor 44 and the central emitter portion 32 so as to thereby create an upper exposed edge 38 of emitter layer 8 and to also create inner and outer exposed upper edges 48 and 50 from the metal layer 44 on the opposite sides of edge 38. As shown in FIG. 13, appropriate electrical connections are provided as indicated schematically by the connections 47, 49 and 51. In this embodiment, the emitter-extraction gate structure is symmetrical in that the two extraction gates formed from metal layer 44 are separated from the emitter or cathode 38 by insulators 40 and 42 which are of equal thickness because they are formed from the same insulating layer 34 in the manner described above.

The structure of the gated field emitter device 300 shown in FIG. 13 differs from the gated field emitter device 100 shown in FIG. 7, if at all, in the relative thickness of conductive upper edges 48 and 50 of device 300 (FIG. 13) as compared with the relative thickness of gate layers 128 and 130 of device 100 (FIG. 7), and the relative thickness of insulator layers 40 and 42 of device 300 (FIG. 13) as compared with the relative thickness of insulating layers 6 and 10 of device 100 (FIG. 7). Because the conductive exposed edges 48 and 50 of device 300 are made from the same conductive layer 44, they have substantially the same thickness. Because the insulator layers 40 and 42 of device 300 are made from the same insulator layer 34, they also have substantially the same thickness. The corresponding structures of gated field emitter device 100 (FIG. 7) need not necessarily have the same thickness.

Figure 15:
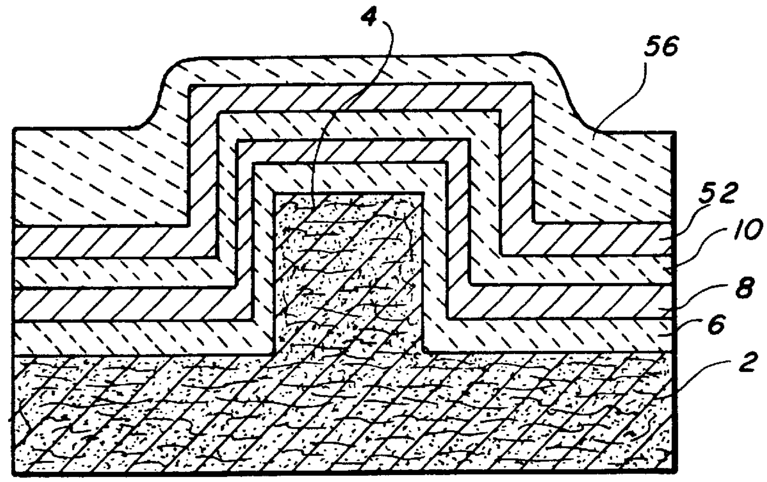
FIG. 15 is a cross-sectional view of the structure of FIG. 14 after the addition of a planarization masking layer.
Figure 16:
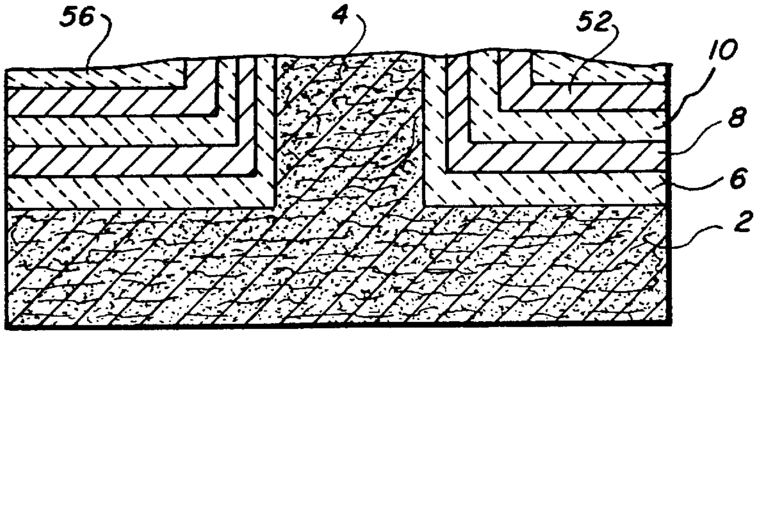
FIG. 16 is a cross-sectional view of the structure of FIG. 15 after etching away part of the insulating and conducting layers of the structure of FIG. 15.
Figure 17:
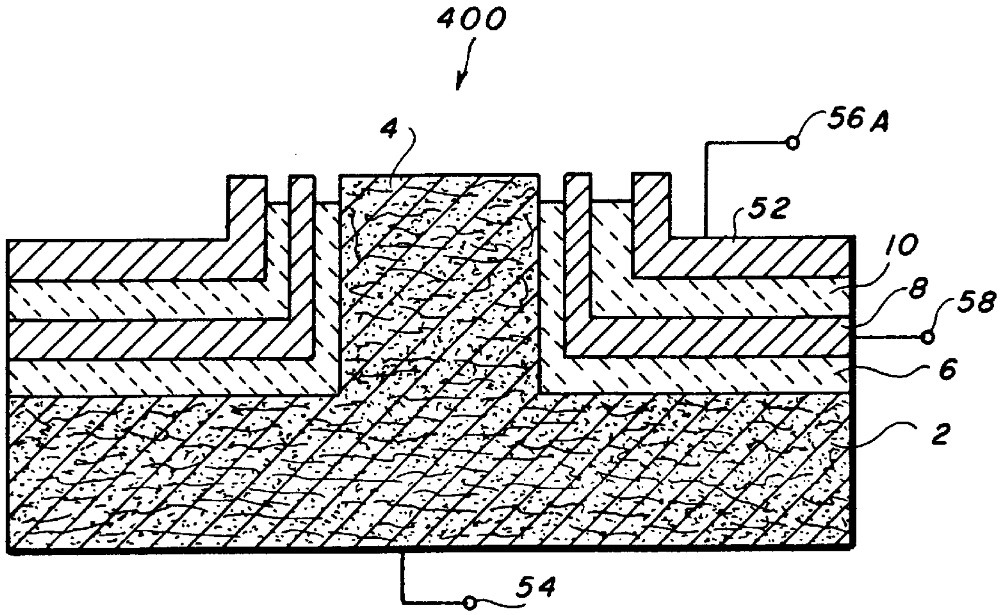
FIG. 17 is a cross-sectional view of a gated field emitter device formed by selectively etching away portions of the structure of FIG. 16.
Figure 18A:
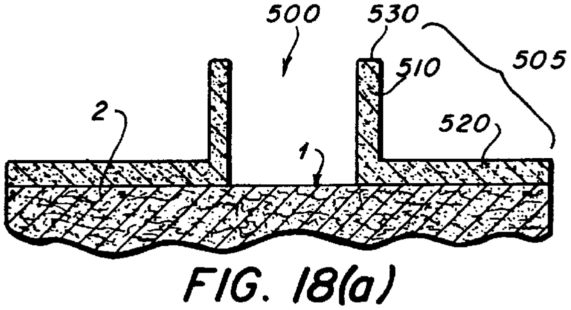
FIGS. 18 (a)–(g) are cross-sectional views of ungated field emitter devices.
Figure 18B:
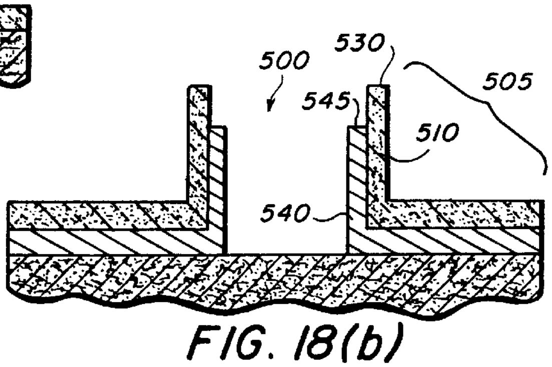
Figure 18C:
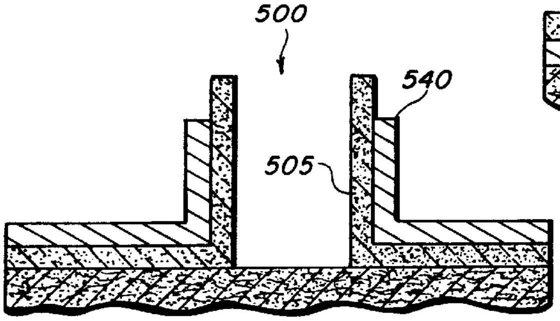
Figure 18D:
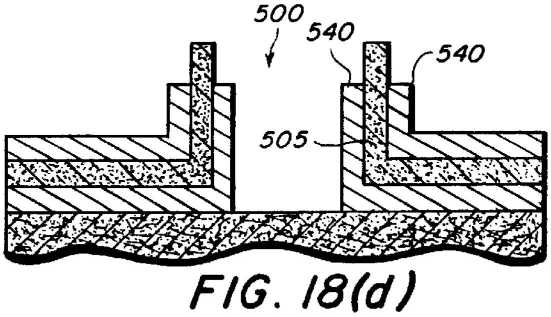
Figure 18E:
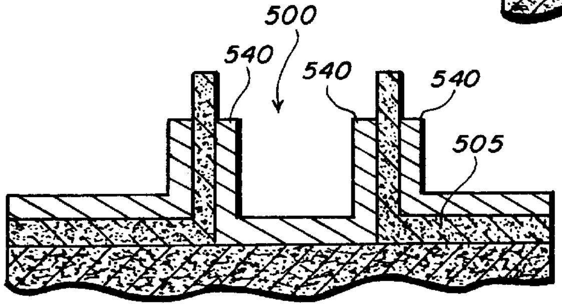
Figure 18F:
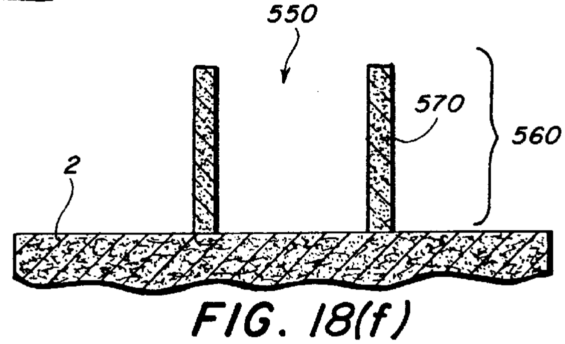
Figure 18G:
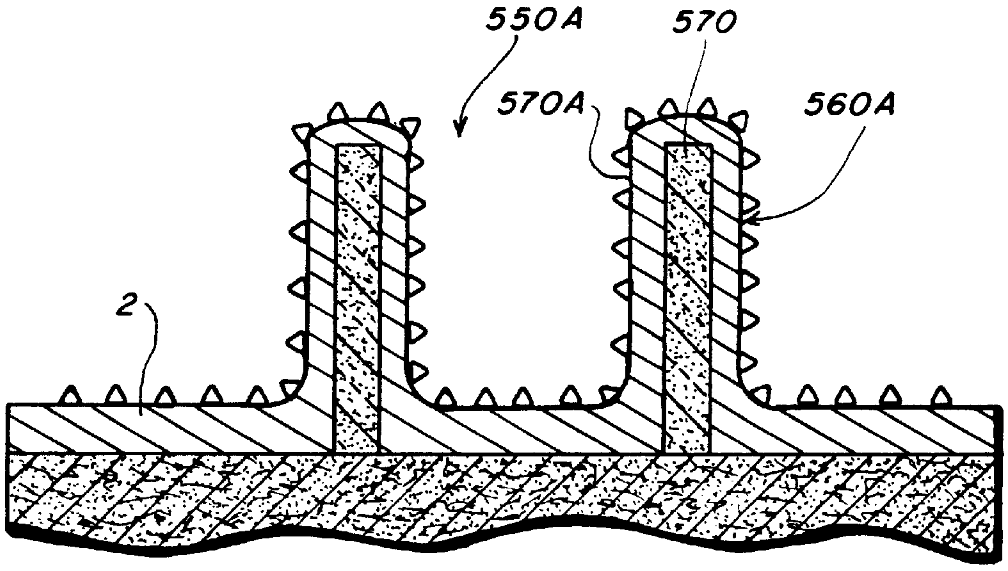
Figure 19A:
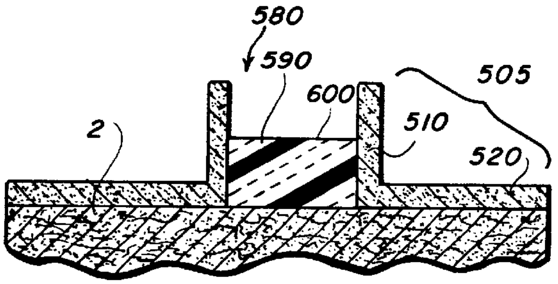
FIGS. 19 (a)–(g) are cross-sectional views of ungated field emitter devices each having a central supporting structure.
Figure 19B:
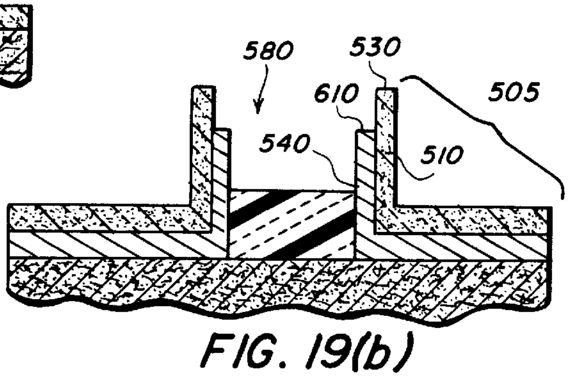
Figure 19C:
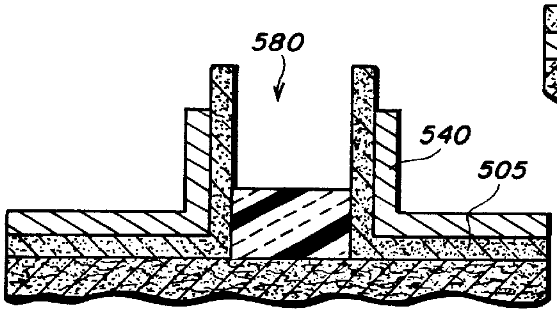
Figure 19D:
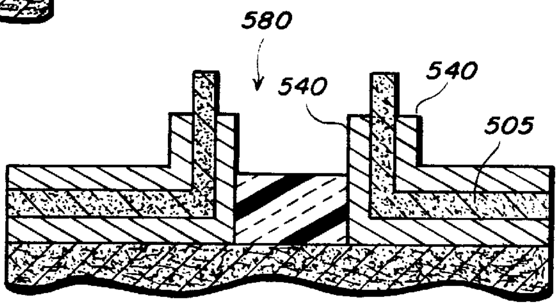
Figure 19E:
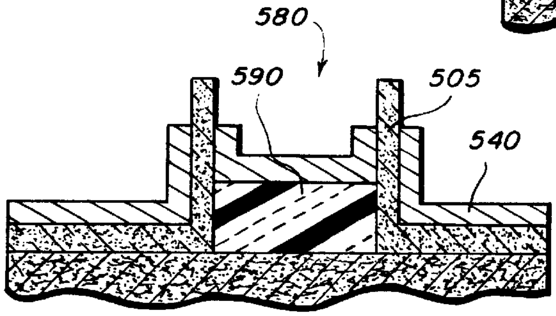
Figure 19F:
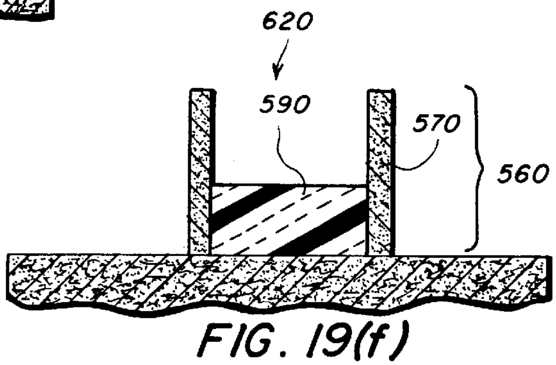
Figure 19G:
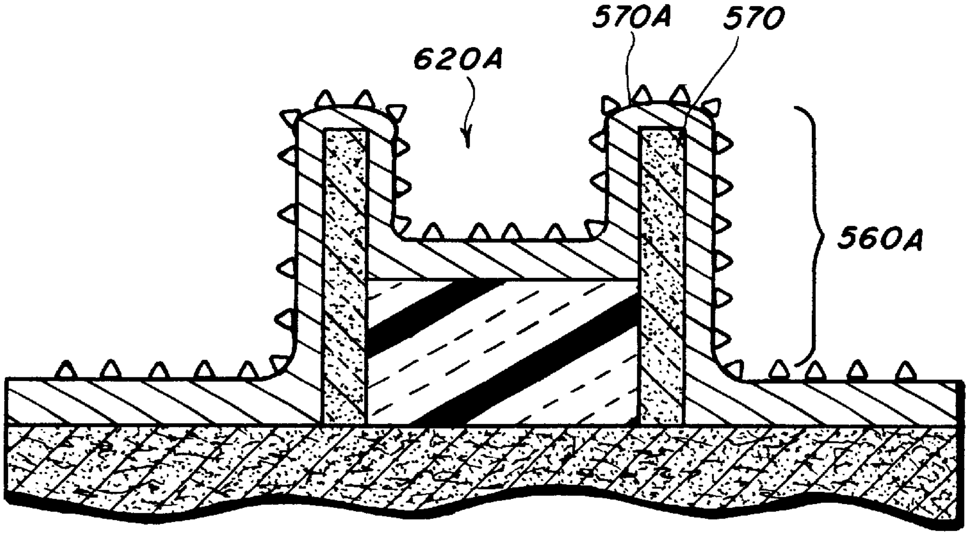
Figure 20A:
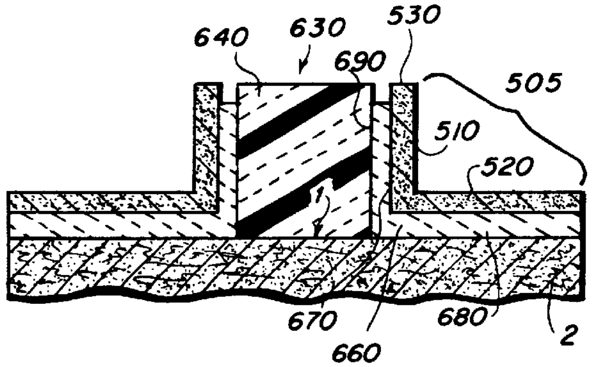
FIGS. 20 (a)–(d) are cross-sectional views of single gated field emitter devices each having a central supporting structure.
Figure 20B:
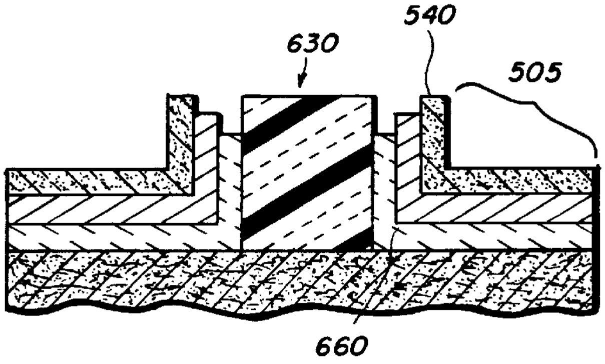
Figure 20C:
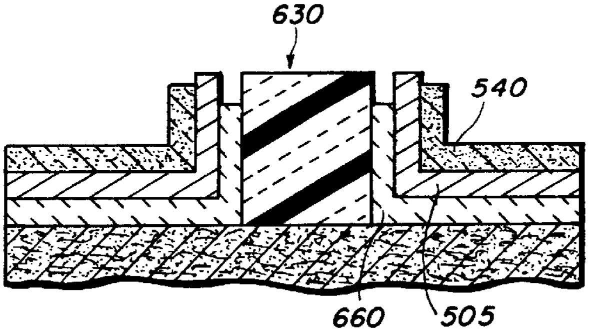
Figure 20D:
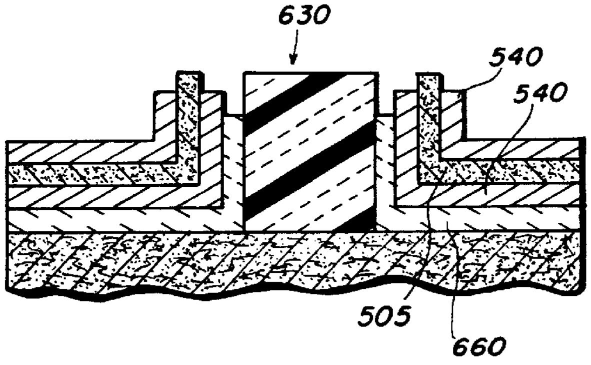

Turning now to the consideration of a third embodiment of the gated emitter device of the invention, and referring to FIGS. 14 to 17, in this embodiment, as will be evident from the discussion below, the protuberance or raised template 4 is used as one extraction gate and the overall process can thus be simplified. Unlike the other embodiments described above, this embodiment must include a conductive substrate 2 with protrusion 4 and side-wall 5. The method of fabrication begins with the structure shown in FIG. 2 and an additional conducting layer 52 is conformably deposited over the upper surface of the basic structure of FIG. 2. This results in the four layer "sandwich" structure shown in FIG. 14. Most preferably, the additional conducting layer 52 is platinum. The structure is then planarized as described above by applying a masking or resist material such that the resultant resist layer 56 produced is thicker above the lower horizontal surfaces and along the sides than above the top of the structure, as shown in FIG. 15. The top of the basic structure shown in FIG. 15 is then removed by using, e.g., ion beam sputtering, RIE or any directed or isotropic removal technique, so as to produce the structure shown in FIG. 16, wherein the upper edges of the insulating layers 6 and 10 and conducting layers 8 and 52 are exposed. A hydrogen fluoride (HF) etch, RIE or any suitable technique is then used to remove an additional portion of insulating layers 6 and 10, and finally, the resist layer 56 is removed to produce the structure shown in FIG. 17. The exposed edge of inner cylindrical film 8 serves as the field emitter or cathode of the device, while the central raised template or protuberance 4 and outer conducting layer 52 serve as the extraction gates. As shown in FIG. 17, appropriate electrical connections are provided as indicated schematically by the connections 54, 56A and 58. For example, the electrical connection to conductive film layer 8 can be in the form of contact pad connection obtained by etching or ion-milling a portion of layers above layer 8.

In a field emitter device according to the present invention, one or more additional conductive layers (not shown) may be disposed on the sides of emitter layer 8 (FIGS. 7, 8, 13, and 17). These additional conductive layers do not extend to the emitting edge of the emitting layer 8. The one or more emitting layer 8 and one or more additional layers together form the electron emitting portion of the device. The one or more additional conductive layers provide enhanced mechanical strength as well as increased current carrying capability. Since the one or more additional layers do not extend to the emitting edge of the emitting layer 8, they do not increase the radius of curvature of the emitting edge and therefore do not interfere with electron emission.

It will be appreciated from the foregoing that while with prior art FEAs a mask was previously required to define the aperture size and to determine the height of the field emitter, in the device of the present invention, the radius of curvature of the field emitter and the spacing between the extraction gates and the emitter are determined by the deposition thickness employed, i.e., the thicknesses of the constituent films forming the device. Moreover, as mentioned previously, since the size of the area to be manufactured is no longer limited by a high spatial resolution lithography process, a large area of field emitters may be manufactured simultaneously using so-called parallel processing techniques. In this regard, all steps, with the exception of the planarization steps, may be performed in a single gaseous chemical beam etching and deposition chamber. Consequently, high spatial registration or masking and the use of high spatial resolution lithography required with conventional techniques are eliminated, thereby enabling, as discussed above, the inexpensive fabrication of large areas of field emitters in a single step.

The process can be carried out on a variety of substrates including conducting and non-conducting substrates as well as film substrates and the like, depending on the application. In addition, the array of field emitters produced can be made in a variety of patterns such as parallel straight lines, crossing lines, patterned lines, orthogonal lines, off-orthogonal lines, segments of lines and the like. Furthermore, protective resistive films can be easily applied to each device. The manufacturing costs should be extremely small and area uniformity should be excellent. Both thick and thin-films can be mixed to provide current sharing, mechanical strength, and protection from "tip blowup."

The substrates can be made in sheet form and the protuberances or raised templates can be molded, formed, bent or made into virtually any shape or size. Forms or molds for the protuberances for the thin-film edge field emitters can be easily made by the same methods used to make phonograph records or beverage bottles, namely a stamp-and-go process. Hence the substrates could be stamped out, used to form the structures, and then maintained or etched away. This would provide a very economical means for the manufacture of inexpensive HDTV screens or other large area uses such as high voltage switches, electrostatic discharge (ESD) protection devices, a new class of Xerox type copy machines, cathodes for e-beam welders, CRTs, linear beam tubes, shaped cathodes such as Pierce cathodes, flat panel monitors, "eyeglass" displays, wrap-around displays for automobile or aircraft displays, and the like.

It is also envisioned that semiconductors, cermets, compounds which are both conducting and non-conducting, overlayers, and the like can also be used in the present invention.

An example of another embodiment within the scope of this invention is a thin-film edge field emitter device which includes at least two layers disposed on the substrate as described earlier. The at least two layers are on the side-wall, at least one of the at least two layers including a conductive thin-film including a portion extending beyond the side-wall and defining an exposed emitter edge suitable for emitting electrons. Just as with the embodiments described above in detail, this embodiment may include various features, such as having conductive layers, insulating layers, and additional layers. This device is fabricated by methods similar to the methods described earlier, as readily determined by a person of ordinary skill in the art.

The above-stated concepts also apply to ungated thin film edge field emitter devices, i.e. those having no extraction gate, and to thin film edge field emitter devices having a single extraction gate.

Referring now to FIG. 18(*a*), an ungated field emitter device 500 is shown in cross-sectional view. Device 500 consists of a conducting or semiconducting thin film 505 which comprises a "fence" or hollow shell portion 510 pointing away from the underlying supporting substrate 2 and a second portion 520 which is parallel to the substrate top surface 1, top being used only in the local relative sense. The top surface 1 of the substrate 2 in the region of the second portion 520 is relatively flat on a local scale. The fence portion 510 is substantially perpendicular to the relatively flat substrate surface 1 and the second portion 520 is substantially parallel to the relatively flat substrate surface 1. On a more macroscopic scale, the surface 1 of the substrate can be curved, for example, as the interior of a cylinder. The conducting or semiconducting thin film 505 (henceforth called a thin film emitter layer) has uniform thickness and its edge has a very small radius of curvature.

The substrate 2 can be insulating, conducting, or semiconducting. The device 500 shown in cross-sectional view in FIG. 18(*a*) can have circular symmetry perpendicular to the substrate 2. In other words, the fence portion 510 can be a cylinder perpendicular to the substrate 2. Alternatively, the fence portion 510 can be a vertical fence extending perpendicular to the cross-sectional view shown in FIG. 18(*a*).

If the substrate 2 is conducting or semiconducting, appropriate electrical contact (not shown) is made to the emitter thin film 505 via the substrate 2. If the substrate 2 is insulating, appropriate electrical contact (not shown) is made directly to the emitter thin film. It is preferred if the emitter elements 500 are to be individually addressable. For such a situation, the substrate 2 is insulating and the portion 520 of the film near to the substrate 2 is patterned to give individual electrical contact to each emitter element 505.

During operation of the device 500, electrons are emitted from the exposed thin film edge 530 of the fence portion 510 of the thin film emitter layer 505.

Referring now to FIGS. 18(*b*),(*c*),(*d*), and (*e*), variations of the field emitter device 500 are shown in which one (FIGS. 18(*b*),(*c*)) or more (FIGS. 18(*d*),(*e*)) "supporting layers" 540, which are preferably conducting or semiconducting but which can also be insulating, are situated contiguous to the emitter thin film 505. Referring now to FIG. 18(*b*), the exposed thin film edge 530 of the fence portion 510 of the thin film emitter layer 505 preferably extends beyond the top edge 545 of the supporting layer 540. The one or more supporting layers 540 provide mechanical support, increased current-carrying capacity, and/or removal of heat from the emitter thin film 505. As with the embodiments illustrated in FIGS. 7 and 8, mechanical support provided by the supporting layer 540 enables the emitter thin film 505 to extend a substantial distance above the substrate 2. Increased heat removal is provided by one or more thermally conductive layer 540. The emitter thin film 505 is preferably a material, such as lithium, with a relatively low work function, and the supporting layer 540 is preferably a material, such as platinum, with a higher work function than the emitter thin film 505, and also preferably a material, such as platinum or gold, that is nonreactive to the atmosphere so as to reduce oxidation of the emitter layer 505. As shown further below, a sandwich combination as shown in FIG. 18(*d*) and (*e*) of lithium as the emitter thin film 505 and platinum as the supporting layer 540 gives exceptional performance.

Referring now to FIG. 18(*f*), a field emitter device 550 is shown in which the emitter thin film 560 includes a "fence" or hollow shell portion 570 pointing away from the underlying supporting substrate 2 and does not necessarily include a second portion 520 (FIG. 18(*a*)) parallel to the substrate surface 1. Just as in FIGS. 18(*b*),(*c*),(*d*), and (*e*), the field emitter device 550 can be varied by having one or more "supporting layers" (not shown), which supporting layers are preferably conducting or semiconducting but which can also be insulating situated contiguous to the emitter thin film 570.

Referring now to FIG. 18(*g*), a field emitter device 550A is shown in which the coated emitter thin film 560A includes a conductive or semiconductive film 570A that contains crystallites with sharp edges, such as CVD diamond film, the film 570A coating the thin film structure 570 of FIG. 18(*f*). Similarly, all the previously described structures 500 (FIGS. 18(*b*)–(*e*)) that have one or more supporting layers 540 can be varied by having a conductive or semiconductive film 570A that contains crystallites with sharp edges, such as CVD diamond film, coating the films 505 and 540.

Referring now to FIG. 19(*a*), an ungated field emitter device 580 is shown in cross-sectional view. As with device 500 (FIGS. 18(*a*)–(*f*)), device 580 consists of a thin film emitter layer 505 which comprises a "fence" or hollow shell portion 510 pointing away from the underlying supporting substrate 2 and a second portion 520 which is parallel to the substrate surface 1. The thin film emitter layer 505 is supported from inside by a central supporting structure 590 extending from the substrate 2. The central supporting structure 590 can be of the same or different material than the substrate 2. This structure 580 is more mechanically durable than the structure 500 shown in FIG. 18(*a*). The exposed thin film edge 530 of the fence portion 510 of the thin film emitter layer 580 extends beyond the top surface 600 of the central supporting structure 590 and is for emission of electrons during operation of the device 580. The central supporting structure 590 is preferably a conductor or semiconductor but can also be an insulator and especially a thermally conductive insulator for enhanced current carrying and/or heat removal from the emitting thin film emitter layer 505.

Referring now to FIGS. 19(*b*),(*c*),(*d*) and (*e*), variations of the field emitter device 580 are shown in which one (FIGS. 19(*b*),(*c*)) or more (FIGS. 19(*d*),(*e*)) "supporting layer" 540 is situated contiguous to the emitter thin film 505 as in FIGS. 18(*b*),(*c*),(*d*) and (*e*). The supporting layer 540 is preferably conducting or semiconducting, especially if the central supporting structure 590 is an insulator, but the supporting layer 540 can also be insulating. Referring now to FIG. 19(*b*), the exposed thin film edge 530 of the fence portion 510 of the thin film emitter layer 580 preferably extends beyond the top edge 610 of the supporting layer 540.

Referring now to FIG. 19(*f*), a field emitter device 620 is shown in which the emitter thin film 560 includes a "fence" or hollow shell portion 570 pointing away from the underlying supporting substrate 2 and does not necessarily include a second portion 520 (FIG. 19(*a*)) which is parallel to the substrate surface 1. In all other respects, the device 620 is the same as the device 580 shown in FIG. 19(*a*). Just as in FIGS. 19(*b*),(*c*),(*d*), and (*e*), the field emitter device 620 can be varied by having one or more "supporting layers" (not shown), which supporting layers are preferably conducting or semiconducting but which can also be insulating situated contiguous to the emitter thin film 570.

Referring now to FIG. 19(*g*), a field emitter device 620A is shown in which the coated emitter thin film 560A includes a conductive or semiconductive film 570A that contains crystallites with sharp edges, such as CVD diamond film, the film 570A coating the thin film structure 570 of FIG. 19(*f*). Similarly, all the previously described structures 580 (FIGS. 19(*b*)-(*e*)) that have one or more supporting layers 540 can be varied by having a conductive or semiconductive film 570A that contains crystallite with sharp edges such as CVD diamond film, coating the films 505 and 540.

Referring now to FIG. 20(*a*), a single gated field emitter device 630 is shown in cross-sectional view. As with device 500 (FIGS. 18(*a*)-(*e*)) and device 580 (FIGS. 19(*a*)-(*e*)), device 630 consists of a thin film emitter layer 505 which comprises a "fence" or hollow shell portion 510 pointing away from the underlying supporting substrate 2 and a second portion 520 which is parallel to the substrate surface 1. As with device 580 (FIGS. 19(*a*)-(*e*)), the device 630 includes a central supporting structure 640. In device 630, the central supporting structure 640 is suitable for use as a gate. It is conducting or semiconducting and has an exposed corner 650. The fence portion 510 of the thin film emitter layer 505 has an exposed thin film edge 530. The exposed thin film edge 530 is preferably of about the same height from the substrate surface 1 as the exposed supporting structure corner 650.

The thin film emitter layer 505 is attached to, although not necessarily contiguous with an insulator layer 660 which has a first portion 670 pointing away from the underlying supporting substrate 2 and a second portion 680 parallel to the substrate surface 1. The first portion 670 is attached to the sidewall 690 of the central supporting structure 640 and the first portion 510 of the thin film emitter layer 505 is attached to the first portion 670 of the insulator 660. The second portion 680 of the insulator 660 is attached to the top surface 1 of the substrate 2 and the second portion 520 of the thin film emitter layer 505 is attached to the second portion 680 of the insulator 660. The exposed edge 530 of the thin film emitter layer 505 preferably extends further from the substrate surface 1 than the insulator 660.

During operation of the device 630, electrons are emitted from the exposed thin film edge 530 of the fence portion 510 of the thin film emitter layer 505 and the corner 650 of the central supporting structure 640 serves as an extracting gate when a positive bias potential is applied to it with respect to the thin film emitter layer 505.

Referring now to FIGS. 20(*b*),(*c*), and (*d*), variations of the field emitter device 630 are shown in which one (FIGS. 20(*b*),(*c*)) or more (FIG. 20(*d*)) "supporting layer" 540 is situated contiguous to the emitter thin film 505 as in FIGS. 18 (*b*)-(*e*). Referring now to FIG. 20(*b*), the exposed thin film edge 530 of the fence portion 510 of the thin film emitter layer 505 preferably extends beyond the top edge 610 of the supporting layer 540. As shown in FIGS. 20(*b*) and (*d*), the supporting layer 540 can be between the insulator 660 and the emitter thin film 505, in which case the emitter thin film 505 is attached to but not necessarily contiguous with the insulator 660.

Figure 21A:
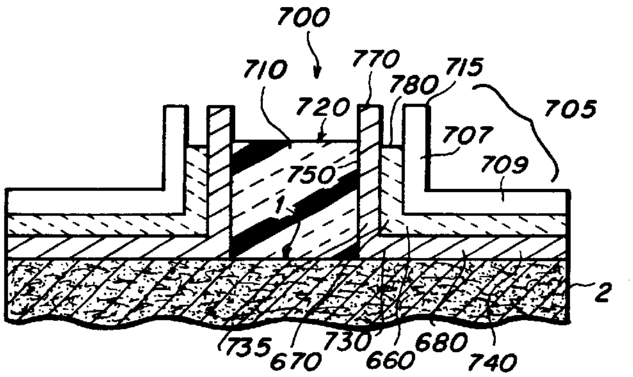
FIGS. 21 (a)–(d) are cross-sectional views of single gated field emitter devices each having a central supporting structure.
Figure 21:
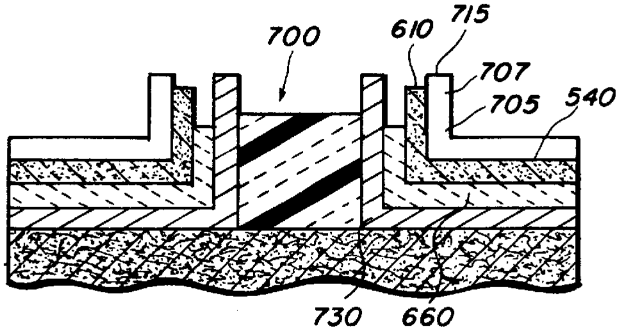
Figure 21C:
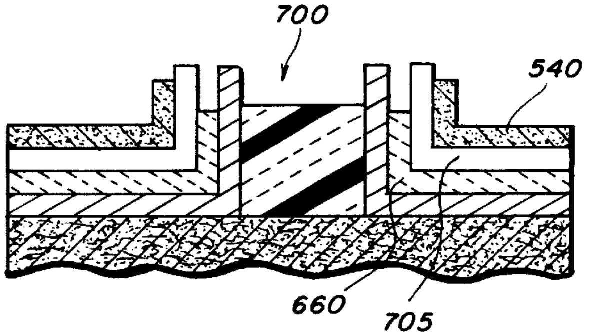
Figure 21D:
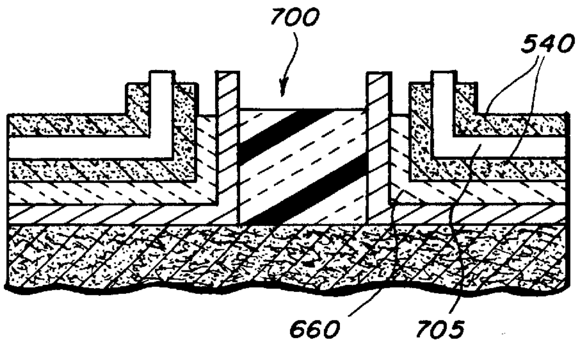
Figure 22:
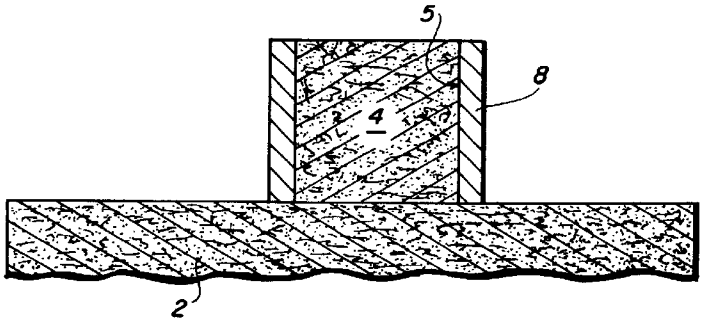
FIG. 22 is a cross-sectional view of an intermediate structure made in the manufacture of the devices 550 and 620 of FIGS. 18(*f*) and 19(*f*).

Referring now to FIG. 21(*a*), a single gated field emitter device 700 is shown in cross-sectional view. As with device 500 (FIGS. 18(*a*)-(*e*)), device 580 (FIGS. 19(*a*)-(*e*)), and device 630 (FIGS. 20(*a*)-(*d*)), device 700 consists of a thin film layer 705 which comprises a "fence" or hollow shell portion 707 pointing away from the underlying supporting substrate 2 and a second portion 709 parallel to the substrate surface 1. Unlike device 500 (FIGS. 18(*a*)-(*e*)), device 580 (FIGS. 19(*a*)-(*e*)), and device 630 (FIGS. 20(*a*)-(*d*)), the thin film layer 705 is not necessarily suitable for use as an emitter.

As with device 580 (FIGS. 19(*a*)-(*e*)), and device 630 (FIGS. 20(*a*)-(*d*)), the device 700 includes a central supporting structure 710. In device 700, the central supporting structure 710 can be conducting, semiconducting or insulating. The fence portion 707 of the thin film layer 705 has an exposed thin film edge 715. The exposed thin film edge 715 preferably extends beyond the top surface 720 of the central supporting structure 710.

The thin film layer 705 is attached to, although not necessarily contiguous with an insulator layer 660 which has a first portion 670 pointing away from the underlying supporting substrate 2 and a second portion 680 parallel to the substrate surface 1. The insulator layer 660, in turn, is attached to a conducting layer 730 which has a first portion 735 pointing away from the underlying supporting substrate 2 and a second portion 740 parallel to the substrate surface 1. The first portion 670 of the insulating layer 660 is attached to first portion 735 of the conducting layer 730, which itself is attached to the sidewall 750 of the central supporting structure 710. The first portion 707 of the thin film layer 705 is attached to, but not necessarily contiguous to the first portion 670 of the insulator 660. The second portion 680 of the insulator 660 is attached to the second portion 740 of the conducting layer 730, which itself is attached to the and parallel to the top surface 1 of the substrate 2. The second portion 709 of the thin film layer 705 is attached but not necessarily contiguous to the second portion 680 of the insulator 660. The thin film layer 705 and the conducting layer 730 each have exposed edges 715 and 770, respectively, which protrude above the top surfaces 780 and 720 of the insulating layer 660 and the central supporting structure 710, respectively.

During operation of one embodiment of the device 700, electrons are emitted from the exposed thin film edge 715 of the fence portion 707 of the thin film layer 705 and the exposed edge 770 of the conducting layer 730 serves as an extracting gate when a positive bias potential is applied to it with respect to the thin film layer 705. During operation of a second embodiment of the device 700, the polarity of the thin film layer 705 and the conducting layer 730 is reversed from the above. Electrons are emitted from the exposed edge 770 of the conducting layer 730 and the exposed thin film edge 715 of the fence portion 707 of the thin film layer 705 acts as an extracting gate.

Referring now to FIGS. 21(*b*),(*c*), and (*d*), variations of the field emitter device 700 are shown in which one (FIGS. 21(*b*), (*c*)) or more (FIG. 21(*d*)) "supporting layer" 540 is situated contiguous to the emitter thin film 705 as in FIGS. 18 (*b*)-(*e*). Referring now to FIG. 21(*b*), the exposed thin film edge 715 of the fence portion 707 of the thin film emitter layer 705 and the exposed edge 770 of the conducting layer 730 preferably extend beyond the top edge 610 of the supporting layer 540. As shown in FIGS. 21(*b*) and (*d*), the supporting layer 540 can be between the insulator 660 and the emitter thin film 705, in which case the emitter thin film 705 is attached to but not necessarily contiguous with the insulator 660.

Just as the thin film layer 705 can be supported by a supporting layer 540, so the conducting layer 730 can be supported by a supporting layer (not shown), on either side of it. Such supporting layers would be comparable to the supporting layers 540 shown in FIGS. 19(*b*)-(*e*) for supporting the thin film emitter layer 505.

Referring back to FIGS. 1, 18(*a*) and 19(*a*), manufacture of the devices 500 and 580 starts with a substrate 2 having a protuberance 4 of the same or different composition as the substrate 2. As discussed earlier, the protuberance 4 has sidewalls 5 extending substantially vertically from the top surface 1 of the substrate 2. As discussed above, the top surface 1 of the substrate 2 need only be locally flat and horizontal. Horizontal is used as a local descriptor, but such usage is not intended to limit the orientation of the devices 500, 580, or the manufacture thereof. The manufacture starts and proceeds as described earlier with respect to gated devices 100 and 200 of FIGS. 7 and 8, respectively.

Referring now to FIG. 2, a thin film conducting or semiconducting layer 8 is conformally deposited over the surfaces of the protuberance 4 and the top surface 1 of the substrate 2 by the techniques discussed earlier.

Referring now to FIG. 3, a planarization masking layer 12 is applied over the thin film layer 8, as discussed above.

Referring now to FIG. 4, a portion of the planarization layer 12 and the thin film layer 8 are removed by etching or sputtering, as discussed above.

Referring now to FIG. 5, as discussed above, selective etching removes a portion of the protuberance 4 and the remainder of the planarization layer 12 is removed, without removing the thin film layer 8, thereby resulting in the device 580 of FIG. 19 (*a*). That part of the protuberance 4 which remains is the central supporting structure 590, and the thin film layer constitutes the emitter thin film 505.

In order to manufacture the device 500 of FIG. 18(*a*), the protuberance 4 of FIG. 4 is completely removed by selective etching, for example, RIE. In all other respects, device 500 of FIG. 18(*a*) is manufactured by the same technique as device 580 of FIG. 19(*a*).

Referring now to FIGS. 18(*a*)–(*e*) and 19(*a*)–(*e*), the field emitter devices 500 and 580 of FIGS. 18(*b*)–(*d*) and 19(*b*)–(*d*) are manufactured by depositing the corresponding supporting layers 540 in the appropriate order in the step shown in FIG. 2. Similarly, the emitter devices 500 and 580 of FIGS. 18(*e*) and 19(*e*) are manufacturing by depositing the appropriate supporting layers 540 on the structures shown in FIGS. 18(*c*) and 19(*c*), respectively. The emitter thin film layer 505 is manufactured to protrude above the supporting layer or layers 540 by using a selective etching step which etches the supporting layer material 540 at a faster rate than the emitter layer 505.

This selective etching step is preferably directed perpendicular to the substrate top surface 1.

Referring back to FIGS. 1, 2, 3, and 20(*a*), manufacture of the device 630 starts in the same manner as manufacture of devices 100, 200, 500 and 580 of FIGS. 7, 8, 18(*a*) and 19(*a*), respectively, except that the protuberance 4 is preferably conducting or semiconducting and an insulating layer 6 is conformally deposited over surfaces of the protuberance 4 and the top surface 1 of the substrate 2 by the techniques discussed earlier before the thin film conducting or semiconducting layer 8 is deposited on top of the insulating layer 6.

Figure 23A:
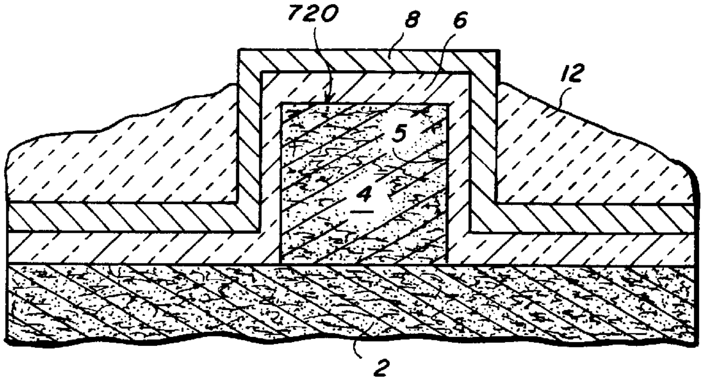
FIGS. 23(*a*) and (*b*) are cross-sectional views of intermediate structure made in the manufacture of device 630 of FIG. 20(*a*).
Figure 23B:
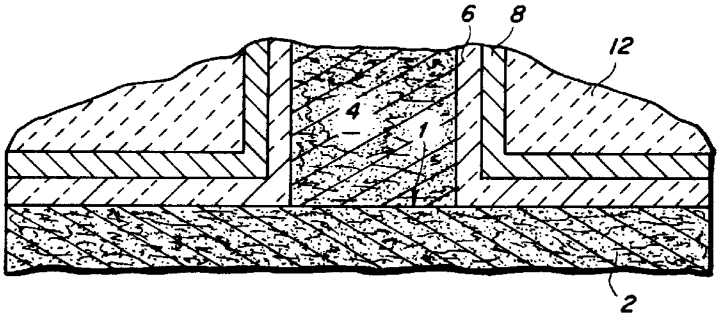

Referring now to FIG. 23(*a*), a portion of the planarization layer 12 of FIG. 3 is removed, preferably by etching or directional removal perpendicular to the substrate, as discussed above. In the resulting structure, the top surface 720 and at least part of the sidewall 5 of the protuberance 4 are covered with layers 6 and 8 and not protected by the remaining planarization layer 12.

Referring now to FIG. 23(*b*), those parts of layers 6 and 8 which are exposed and not protected by the remaining planarization layer 12 are removed. Selective etching, preferably perpendicular to the substrate surface 1, of a small portion of the exposed insulator layer 6 and removal of the planarization layer 12 results in the structure 630 of FIG. 20(*a*), in which the top of the insulating layer 660 is recessed from the exposed edge 530 of the emitter thin film layer 505 and from the exposed corner 650 of the central supporting structure 640.

Referring back to FIGS. 20(*a*)–(*d*), the field emitter devices 630 of FIGS. 20(*b*)–(*d*) are manufactured by depositing the corresponding supporting layers 540 in the appropriate order in the step shown in FIG. 2. To have the supporting layers 540 be recessed with respect to the emitter thin film layer 505, a selective etching perpendicular to the substrate surface 1 is used to etch the supporting layer 540 at a faster rate than the thin film layer 505.

Referring back to FIGS. 1, 2, 3, 21(*a*), and 23(*a*), manufacture of the device 700 starts in the same manner as manufacture of device 630 of FIG. 20(*a*), except that the protuberance 4 can be insulating, conducting or semiconducting and a conducting or semiconducting layer 8A is conformally deposited over surfaces of the protuberance 4 and the top surface 1 of the substrate 2 by the techniques discussed earlier before the insulating layer 6 is deposited. The same procedures for planarization and the removal of the top layers (three: 8A, 6 and 8 instead of two: 6 and 8) are followed, resulting in a structure similar to that of FIG. 23(*a*) except that there are three layers: 8A, 6 and 8.

Figure 24:
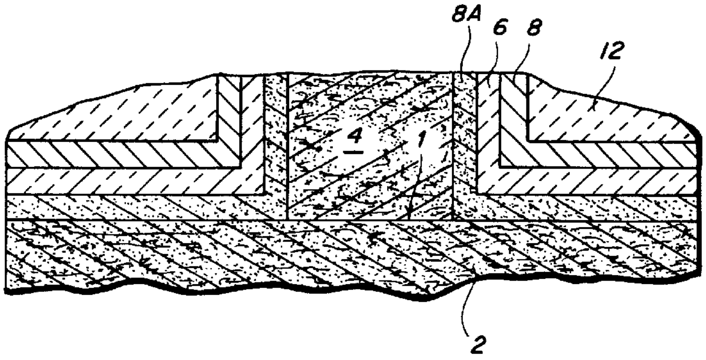
FIG. 24 is a cross-sectional view of an intermediate structure made in the manufacture of device 700 of FIG. 21(*a*).
Figure 25A:
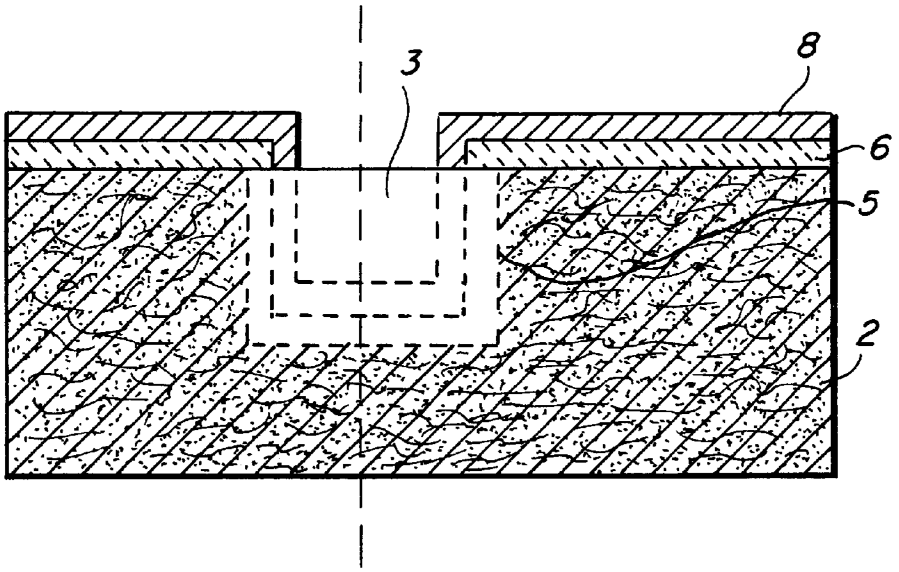
FIG. 25(*a*) is a side view of an intermediate structure of an embodiment wherein the sidewall defines a trough in the substrate.
Figure 25B:
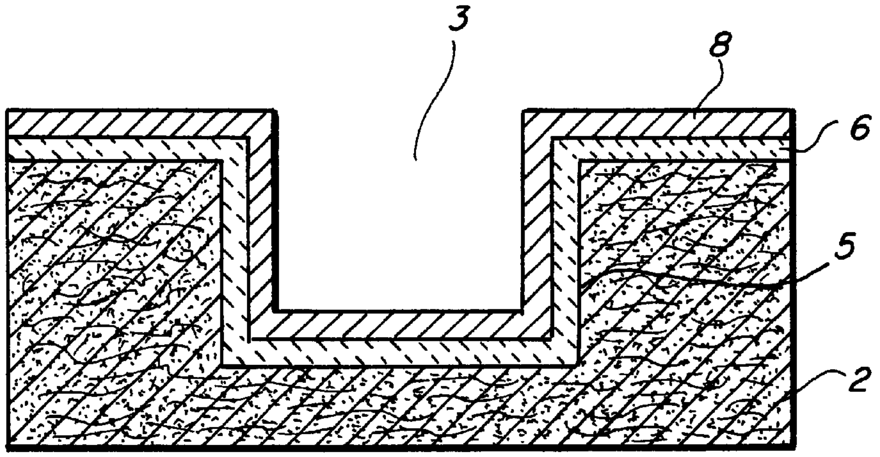

Referring now to FIG. 24, those parts of layers 8A, 6 and 8 which are exposed and not protected by the remaining planarization layer 12 are removed. Selective etching, preferably perpendicular to the substrate surface 1, which selective etching is likely performed in three steps, of a small portion of the exposed insulator layer 6, of a small portion of the exposed protuberance 4, and removal of the planarization layer 12 results in the structure 700 of FIG. 21(*a*), in which the top surfaces 780 and 720 of the insulating layer 660 and the central supporting structure 710, respectively are recessed from the exposed edges 715 and 770 of the thin film layer 705 and the conducting layer 730, respectively.

Referring back to FIGS. 21(*a*)–(*d*), the field emitter devices 700 of FIGS. 21(*b*)–(*d*) are manufactured by depositing the corresponding supporting layers 540 for layer 705 in the appropriate order in the step shown in FIG. 2 before or after depositing the semiconductive or conductive thin film layer 8. Similarly, supporting layers (not shown) for layer 730 are deposited in the appropriate order in the step shown in FIG. 2 before or after depositing the semiconductive or conductive thin film layer 8A. Selective etching perpendicular to the substrate surface 1 is used to etch the supporting layers at a faster rate than the layers 705 or 730 as appropriate in order to have the supporting layers 540 for layer 705 and for layer 730 be recessed with respect to the layers 705 and 730.

EXAMPLES

Having described the invention in general, the following examples are given as particular embodiments thereof and to demonstrate the practice and advantages thereof. It is understood the example is given by way of illustration and is not intended to limit the specification or the claims to follow in any manner.

EXAMPLE 1

This example is shown in FIG. 18(*d*) and constitutes a lithium layer sandwiched between two platinum layers. It was manufactured as follows:

(1) The starting work piece consisted of a 10×10 array of silicon template structures 10 μm in diameter and 2 μm in height, spaced at 500 μm apart, and centered in a 5×5 millimeter (mm) area on a 1×1 cm piece of n-type Si(100) overcoated with a 200 Ålayer of amorphous silicon. These cylindrical protuberances were fabricated using standard photo-lithographic methods.

(2) The sample was cleaned by 5 minute immersions in warm acetone, 10% buffered HF, $H_2SO_4/H_2O_2$, 10% buffered HF, and 1% buffered HF. A triple-distilled water rinse was used between each step except before the last HF treatment. the work piece was then mounted on a heater on a manipulator, and placed in a vacuum chamber pumped by a liquid-nitrogen trapped diffusion pump. The base pressure was $9\times10^{-8}$ Torr. the work piece was heated to 510° C. for 30 minutes to dehydrate the surface. It was then cooled down to and maintained at 291° C.

(3) The sample was placed at 3 mm from and perpendicular to the end of the first 1.27 cm diameter doser tube. A 3:17 mixture of Pt(PF3)4:H2 at a total pressure of 2×10−5 Torr (measured on an ionization gauge in the chamber) was flowed onto the work piece for 8.0 minutes to deposit the first layer Pt film. To deposit the lithium layer, the sample was positioned in similar fashion at the end of a second doser. Without adjusting the temperature, a 1:9 mixture of t-butyl Li:$H_2$ at a total pressure of $1\times10^{-5}$ Torr. was flowed onto the sample for 8 minutes, 30 seconds. the final layer of Pt was deposited on top of the Li layer in The same was as the first Pt layer.

(4) The sample was moved to a position perpendicular to the axis of a sputtering gun. Initially, a 1.5 kilo-electron Volt (keV) Ne beam with Ne pressure at 9×10−5 Torr and a beam current of 10 micro-ampere (μA) impinged on the sample for 2 hours, 35 minutes. Then the beam energy was changed to 2.0 keV and the sample was sputtered for an additional period of 1 hour, 25 minutes. At this time it was observed that the layered film was removed from the horizonal surface of the sample substrate.

(5) With the Ne beam energy reduced to 1.0 keV (8 μA beam current) while maintaining the Ne pressure at $9\times10^{-5}$ Torr, $1.6\times10^{-5}$ Torr of $XeF_2$ etchant gas was concurrently flowed onto the same spot on the substrate through a 3.2 mm diameter stainless steel doser tube for 24.0 minutes. At this point, much of the silicon template structure has been removed. After the $XeF_2$ gas was shut off, the sample was sputtered by the Ne beam alone at 1.0 keV for 2 additional minutes to remove possible surface fluorides.

EXAMPLE 2

Steps (1) and (2), the procedures were the same as above except for the following: After the sample was cleaned and treated in HF, some indium metal was melted onto the back side of the substrate with a soldering iron to provide a good conducting contact for electrical connection in the later testing stage. The vacuum chamber base pressure was $3\times10_{-8}$ Torr. The dehydration temperature prior to film deposition was 490° C. for 25 minutes. The deposition temperature was 288° C.

Step (3), the procedures were the same as in step (3) above except that the deposition time for Li was 8 minutes.

Step (4), the procedures were the same as in step (4) above except that the sputtering was done at 2.0 keV starting at the beginning, for 3 hours 30 minutes.

Step (5), the procedures were the same as in step (5) above except that the ion beam assisted etching step was carried out for 15 minutes at a reduced XeF2 pressure of 0.6×10−5 Torr.

EXAMPLE 3

Steps (1) and (2), the procedures were the same as above except for the following: The dehydration temperature was 503° C.

Step (3), the procedures were the same as in step (3) above except that only a Pt film was deposited for 16 minutes. Pressure and temperature conditions were the same as in Example 2.

Step (4), the same procedures were used as in Example 2 above except that the sputtering was done for 2 hours 4 minutes.

Step (5), the procedures were the same as in Example 2 above except that the etching duration was 18.0 minutes.

In a preferred embodiment the typical emitter structure has a shape of a hollow cylinder with nanometer (nm) linewidth wall, 2 μm in height and 10 μm in diameter. The cylinder wall consists of two free-standing platinum thin films sandwiching a third thin film of lower work function material. Critical material properties include very low film stress and fine grain size. The latter property allows 10–20 nm radii of curvature to be obtained. Field emission from these test structures to an Indium-Tin-Oxide (ITO) anode and ZnS phosphor plates placed at a separation of 25 μm has been measured. Turn-on voltages as low as 200–300 Volts have been measured and no apparent deterioration in emission in the voltage range tested (700–800 V) has been observed over a 2 week test period of continuous operation. The tests using phosphor plates show good spatial resolution of dot images.

Although the present invention has been described relative to specific exemplary embodiments thereof, it will be understood by those skilled in the art that variations and modifications can be effected in these exemplary embodiments without departing from the scope and spirit of the invention.

What is claimed is:

1. An thin-film edge field emitter device comprising:

a substrate including a non-flat portion defining at least one side-wall; and at least first and second layers disposed on said substrate including said side-wall;

at least one of said layers comprising a conductive thin-film including a portion extending beyond said side-wall and defining an exposed emitter edge from which electrons are emitted.

wherein said side walls define a trough or recess on said substrate wherein said trough or recess creates a volume bound by said at least first and second layers.

2. The thin-film edge emitter according to claim 1, wherein said side wall is substantially vertical with respect to a horizontal surface of said substrate.

3. The thin-film edge emitter according to claim 1, wherein said side wall extends at an angle of at least about 85° from said horizontal surface of said substrate.

4. The thin-film edge emitter according to claim 3, wherein said side wall extends at an angle of 90° from said horizontal surface of said substrate.

5. A gated thin film edge emitter device comprising:

a substrate including a non-flat portion defining at least one side wall;

at least first, second, third and fourth layers disposed on said substrate including said side wall, a first two of said layers each comprising a thin conductive film including a portion extending beyond said side wall and defining an exposed edge, one of said first two layers comprising a gate and the other of said first two layers comprising an emitter layer and said exposed edge of said emitter layer comprising an exposed emitter edge from which electrons are emitted; and a further two of said layers comprising insulating layers disposed on opposite sides of said emitter layer between the gate-comprising layer and the side wall of said substrate;

wherein said side walls define a trough or recess on said substrate wherein said trough or recess creates a volume bound by said layers.

6. A thin-film edge field emitter device comprising:

(a) a substrate having a first portion and having a depression, said depression defining at least one side-wall, said side-wall constituting a second portion;

(b) at least one emitter layer disposed on said substrate including said second portion, wherein said at least one emitter layer is selected from the group consisting of semiconductors and conductors and comprises a thin-film including a portion extending beyond said second portion and defining an exposed emitter edge;

(c) a pair of supportive layers disposed on opposite sides of said at least one emitter layer, said pair of supportive layers each being selected from the group consisting of semiconductors and conductors.

* * * * *